United States Patent
Tanabe

(10) Patent No.: US 11,281,088 B2
(45) Date of Patent: Mar. 22, 2022

(54) REFLECTIVE MASK BLANK FOR EUV EXPOSURE, AND REFLECTIVE MASK

(71) Applicant: AGC Inc., Chiyoda-ku (JP)

(72) Inventor: Hiroyoshi Tanabe, Tokyo (JP)

(73) Assignee: AGC Inc., Chiyoda-ku (JP)

( * ) Notice: Subject to any disclaimer, the term of this patent is extended or adjusted under 35 U.S.C. 154(b) by 129 days.

(21) Appl. No.: 15/953,580

(22) Filed: Apr. 16, 2018

(65) Prior Publication Data

US 2018/0299766 A1 Oct. 18, 2018

(30) Foreign Application Priority Data

Apr. 17, 2017 (JP) .............................. JP2017-081235

(51) Int. Cl.
*G03F 1/24* (2012.01)
*G03F 1/54* (2012.01)

(52) U.S. Cl.
CPC . *G03F 1/24* (2013.01); *G03F 1/54* (2013.01)

(58) Field of Classification Search
CPC .................. G03F 1/54; G03F 1/58; G03F 1/24
See application file for complete search history.

(56) References Cited

U.S. PATENT DOCUMENTS

2007/0128528 A1* 6/2007 Hess ...................... B82Y 10/00
430/5

FOREIGN PATENT DOCUMENTS

| JP | 4780847 | 9/2011 |
|---|---|---|
| JP | 5282507 | 9/2013 |
| JP | 2015-8283 | 1/2015 |
| JP | 2015-142083 | 8/2015 |
| WO | 2015/098400 | 7/2015 |

OTHER PUBLICATIONS

Kosuke Takai et al., "Process capability of etched multilayer EUV mask", Proc. Of SPIE vol. 9635 96351C-1, 2015 (7 pages).

* cited by examiner

*Primary Examiner* — Daborah Chacko-Davis
(74) *Attorney, Agent, or Firm* — Oblon, McClelland, Maier & Neustadt, L.L.P.

(57) ABSTRACT

A reflective mask blank includes a multilayer reflective film, and a pattern film to be partially etched when processing into a mask. The multilayer reflective film and the pattern film are placed on/above a substrate in this order from the substrate side. The pattern film includes an absorber film and a surface reflection enhancing film in this order from the substrate side. The relation of $((n-1)^2+k^2)^{1/2} > ((n_{ABS}-1)^2 + k_{ABS}^2)^{1/2} + 0.03$ is satisfied, $n_{ABS}$ and $k_{ABS}$ being a reflective index and an absorption coefficient of the absorber film at a wavelength of 13.53 nm, respectively, and n and k being a reflective index and an absorption coefficient of the surface reflection enhancing film at a wavelength of 13.53 nm, respectively.

12 Claims, 8 Drawing Sheets

REFLECTIVE MASK BLANK FOR EUV EXPOSURE, AND REFLECTIVE MASK

CROSS-REFERENCE TO RELATED APPLICATIONS

This application claims priority from Japanese Patent Application No. 2017-081235 filed on Apr. 17, 2017, the entire subject matter of which is incorporated herein by reference.

BACKGROUND OF THE INVENTION

Technical Field

The present invention relates to a reflective mask blank which is an original plate for manufacturing a mask for EUV (Extreme Ultra Violet) exposure to be used in an exposure process for manufacturing a semiconductor, and a reflective mask in which a mask pattern has been formed in a pattern film of the reflective mask blank.

Background Art

In the background art, ultraviolet light having a wavelength of 365 to 193 nm is used as a light source of an exposure apparatus used for manufacturing a semiconductor. As the wavelength is shorter, the resolution of the exposure apparatus becomes higher. Therefore, EUV light having a central wavelength of 13.53 nm is promising as a light source of a next-generation exposure apparatus.

EUV light is so easily absorbed by most of substances that a dioptric system cannot be used as the exposure apparatus. Therefore, a catoptric system and a reflective mask are used for EUV exposure.

In such a reflective mask, a multilayer reflective film which reflects EUV light is formed on a substrate, and an absorber film for absorbing EUV light is patterned on the multilayer reflective film. A protective film for protecting the multilayer reflective film from etching for forming a mask pattern is usually formed between the multilayer reflective film and the absorber film.

A low thermal expansion glass in which a small quantity of titanium has been added to synthetic quartz in order to prevent pattern distortion caused by thermal expansion during exposure is often used as the substrate. A film in which molybdenum films and silicon films have been laminated alternately in about 40 cycles is usually used as the multilayer reflective film. A ruthenium-based material having a thickness of 1 to 5 nm is usually used as the protective film. The ruthenium-based material is very hardly etched with gas which does not contain oxygen. Thus, the ruthenium-based material serves as an etching stopper when processing into the mask. A tantalum-based material is often used as the absorber film. The absorber film is often arranged into a two-layer structure such as a two-layer structure of a tantalum nitride film and a tantalum oxynitride film in order to make it easy to perform pattern defect inspection after the processing into the mask.

EUV light entering the reflective mask from a lighting optical system of the exposure apparatus is reflected by a part (opening portion) where the absorber film is absent, and is absorbed by a part (non-opening portion) where the absorber film is present. In this manner, a mask pattern is transferred onto a wafer through a reduction projection optical system of the exposure apparatus. The EUV light usually enters the reflective mask from a direction tilted at an angle of 6 degrees. When the absorber film has a large film thickness, a part shadowed by the absorber film appears so that the mask pattern cannot be transferred reliably onto the wafer. This problem becomes more conspicuous as the line width of the mask pattern is reduced. It is therefore requested to make the film thickness of the absorber film thinner.

In order to transfer a pattern with high accuracy in EUV exposure, it is necessary to reduce the reflectance in a non-opening portion to be 2% or less when a binary mask is used. Patent Literature 1 describes that the reflectance oscillates depending on the film thickness of an absorber film. FIG. 14 is a schematic sectional view of a reflective mask blank described in Patent Literature 1. In the reflective mask blank 100 shown in FIG. 14, a multilayer reflective film 120, a protective film 130 and an absorber film 140 are formed sequentially on/above a substrate 110. The reflectance of the reflective mask blank 100 in FIG. 14 oscillates depending on the film thickness of the absorber film 140. This is because interference occurs between reflected light A reflected by the multilayer reflective film 120 and reflected light B reflected by the surface of the absorber film 140. There is a minimum value in the reflectance oscillating depending on the film thickness of the absorber film. It is necessary to set the film thickness of the absorber film so as to make the minimum value not larger than 2%.

Patent Literature 2 discloses a reflective mask blank 200 in which a laminated absorber 240 having low-refractive material films and high-refractive material films laminated alternately in a plurality of cycles is provided as an absorber film, as shown in FIG. 15. In the reflective mask blank 200 shown in FIG. 15, a multilayer reflective film 220, a protective film 230 and the laminated absorber 240 are formed sequentially on/above a substrate 210. In this manner, the amplitude of reflected light B reflected by the laminated absorber 240 is increased so that the effect of interference with reflected light A reflected by the multilayer reflective film 220 can be also increased. As a result, the film thickness of the absorber film which can reduce the reflectance to be 2% or less can be made thinner than that in Patent Literature 1.

Patent Literature 1: Japanese Patent No. 4780847
Patent Literature 2: JP-A-2015-8283
Patent Literature 3: Japanese Patent No. 5282507
Patent Literature 4: JP-A-2015-142083
Non-Patent Literature 1: Proceedings of SPIE Vol. 9635 (2015) 96351C

SUMMARY OF THE INVENTION

In the aforementioned background-art reflective mask blank 100 disclosed in Patent Literature 1, it is necessary to make the film thickness of the absorber film 140 more than 60 nm. FIG. 16 shows the simulation result as to reflectance on the assumption that the absorber film has a two-layer structure of a tantalum nitride film and a tantalum oxynitride film (5 nm thick), based on the assumption that, at a wavelength of 13.53 nm, reflectance n and absorption coefficient k of tantalum nitride are (n, k)=(0.947, 0.031), and reflectance n and absorption coefficient k of tantalum oxynitride are (n, k)=(0.959, 0.028). Although reflectance of 2% can be obtained when the film thickness of the absorber film 140 is 54 nm, implementation with the film thickness of 54 nm is not realistic when a variation of about 1 nm in film thickness during film formation is taken into consideration. In consideration of the variation in film thickness, reflectance of 2% or less can be obtained when the film thickness of the absorber film is around 61 nm.

On the other hand, in the reflective mask blank 200 disclosed in Patent Literature 2, the amplitude of the reflected light B reflected by the laminated absorber 240 is larger than those in the background-art reflective mask blank 100. Thus, the reflectance of 2% or less can be achieved even when the film thickness of the absorber film is 60 nm or less.

However, in the reflective mask blank 200 disclosed in Patent Literature 2, the absorber film is constituted by the laminated absorber 240 in which low-refractive material films and high-refractive material films have been laminated alternately in a plurality of cycles. According to Non-Patent Literature 1, there is a problem that a side wall of a multilayer film may be damaged when the multilayer film is etched or cleansed for processing into a mask. There is also concern over the same problem in the laminated absorber 240.

An object of the present invention is to provide a reflective mask blank in which reflectance of EUV light can be made 2% or less even when the film thickness of a pattern film is reduced and which can be easily processed into a mask, and a reflective mask.

In an aspect of the present invention, the followings are provided.

<1> A reflective mask blank which is a binary reflective mask blank comprising:

a multilayer reflective film which reflects EUV light; and a pattern film to be partially etched when processing into a mask, the multilayer reflective film and the pattern film being placed on/above a substrate in this order from the substrate side;

wherein the pattern film includes an absorber film which absorbs EUV light and a surface reflection enhancing film in this order from the substrate side, and the following relation is satisfied:

$$((n-1)^2+k^2)^{1/2} > ((n_{ABS}-1)^2+k_{ABS}^2)^{1/2}+0.03$$

wherein $n_{ABS}$ is a reflective index of the absorber film at a wavelength of 13.53 nm, $k_{ABS}$ is an absorption coefficient of the absorber film at a wavelength of 13.53 nm, n is a reflective index of the surface reflection enhancing film at a wavelength of 13.53 nm, and k is an absorption coefficient of the surface reflection enhancing film at a wavelength of 13.53 nm.

<2> The reflective mask blank according to <1>, wherein the refractive index n of the surface reflection enhancing film is 0.95 or less.

<3> The reflective mask blank according to <1> or <2>, wherein film thickness d of the surface reflection enhancing film satisfies the following relation using the refractive index n:

$$13.53 \text{ nm}/4n \times 0.5 < d < 13.53 \text{ nm}/4n \times 1.5.$$

<4> The reflective mask blank according to <3>, wherein the film thickness d of the surface reflection enhancing film satisfies the following relation:

$$d < 1/10 \times d_{ABS}$$

wherein $d_{ABS}$ is a film thickness of the absorber film.

<5> The reflective mask blank according to any one of <1> to <4>, wherein the surface reflection enhancing film is a ruthenium-based material film containing ruthenium.

<6> The reflective mask blank according to any one of <1> to <5>, wherein a surface reflection assisting film is formed between the absorber film and the surface reflection enhancing film in the pattern film, the surface reflection assisting film satisfying the following relation:

$$n < n_{ABS} < n_B$$

wherein $n_B$ is a refractive index of the surface reflection assisting film at a wavelength of 13.53 nm.

<7> The reflective mask blank according to <6>, wherein the refractive index $n_B$ of the surface reflection assisting film at a wavelength of 13.53 nm is 0.95 or more.

<8> The reflective mask blank according to <6> or <7>, wherein film thickness $d_B$ of the surface reflection assisting film satisfies the following relation using the refractive index $n_B$:

$$13.53 \text{ nm}/4n_B \times 0.5 < d_B < 13.53 \text{ nm}/4n_B \times 1.5.$$

<9> The reflective mask blank according to any one of <6> to <8>, wherein the surface reflection assisting film is a silicon-based material film containing silicon or an aluminum-based material film containing aluminum.

<10> The reflective mask blank according to any one of <1> to <9>, wherein a protective film for protecting the multilayer reflective film is provided between the multilayer reflective film and the pattern film.

<11> The reflective mask blank according to any one of <1> to <10>, wherein a hard mask film to be removed when processing into a mask is provided on the pattern film.

<12> The reflective mask blank according to <11>, wherein the hard mask film is selected from the group consisting of a tantalum-based material film containing a tantalum-based material, a chromium-based material film containing a chromium-based material, and a silicon-based material film containing a silicon-based material.

<13> A binary reflective mask in which a pattern film of the reflective mask blank according to any one of <1> to <12> has been patterned.

In the reflective mask blank and the reflective mask in the present invention, a pattern film which will be partially etched when processing into the mask includes an absorber film and a surface reflection enhancing film in this order from the substrate side. Due to the presence of the surface reflection enhancing film, the amplitude of EUV light reflected by the surface of the pattern film is increased so that the effect of interference with EUV light reflected by a multilayer reflective film can be also increased. By use of the effect of the interference, the film thickness of the pattern film with which the reflectance can be set at 2% or less can be made thinner than the film thickness of an absorber film in the background art.

The reflective mask blank in the present invention can be easily processed into a mask due to its simple film configuration.

DETAILED DESCRIPTION OF THE INVENTION

Embodiment 1

Figure 14:
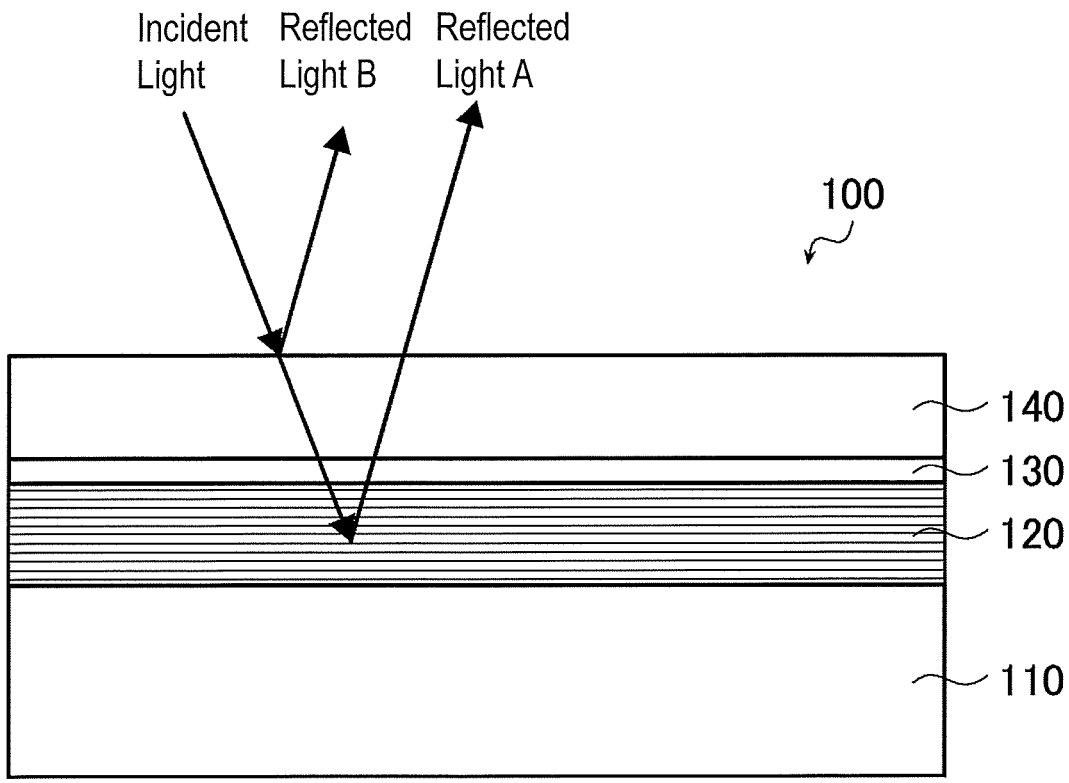
FIG. 14 is a schematic sectional view of a reflective mask blank in Patent Literature 1.

Prior to description of Embodiment 1 of the present invention, the reason why reflectance oscillates depending on the film thickness of an absorber in Patent Literature 1 will be explained. First, the case where the absorber film 140 is absent in FIG. 14 is considered. Only the reflected light A reflected by the multilayer reflective film 120 is present. When the amplitude of the reflected light A on the surface of the protective film 130 is designated as $r_{ML}$, reflectance R of the reflective mask blank 100 is expressed by the following relation (1).

$$R=|r_{ML}|^2 \quad (1)$$

When the multilayer reflective film 120 is a multilayer reflective film which is usually used and has 40 layers composed of molybdenum and silicon, the reflectance R is about 70% at an exposure wavelength λ of 13.53 nm.

Next, the case where the absorber film 140 is present is considered. When the absorber film 140 has a refractive index $n_{ABS}$, an absorption coefficient $k_{ABS}$, and a film thickness $d_{ABS}$, the reflected light A reflected by the multilayer reflective film 120 has an amplitude expressed by the following expression (2) on the surface of the absorber film 140 because the reflected light A travels back and forth over the absorber film 140.

$$r_{ML}\exp(4\pi i(n_{ABS}+ik_{ABS})d_{ABS}/\lambda) \quad (2)$$

Exactly correction of light obliquely incident should be taken into consideration, but the influence is cos(6°)=0.995, that is, not higher than 1%. Therefore, the influence may be neglected.

When the absorber film 140 is present, the reflected light B on the surface of the absorber film 140 is necessary to be taken into consideration. When the reflected light B has amplitude $r_S$, the reflectance R of the reflective mask blank 100 is approximately expressed by the following relation (3).

$$R \approx |r_{ML}\exp(4\pi i(n_{ABS}+ik_{ABS})d_{ABS}/\lambda)+r_S|^2 \quad (3)$$

Although another multiple reflection is also generated in the absorber film 140, the influence thereof is small.

The relation (3) can be rewritten as the following relation (4).

$$R \approx |r_{ML}|^2\exp(-8\pi k_{ABS}d_{ABS}/\lambda)+|r_S|^2+2|r_{ML}||r_S|\exp(-4\pi k_{ABS}d_{ABS}/\lambda)\cos(4\pi n_{ABS}d_{ABS}/\lambda+\Phi) \quad (4)$$

Here, Φ designates a phase difference between $r_{ML}$ and $r_S$. The third term of the relation (4) designates an interference term between the reflected light A reflected by the multilayer reflective film 120 and the reflected light B on the surface of the absorber film 140. Due to the influence of this interference, the reflectance R oscillates depending on the film thickness $d_{ABS}$ of the absorber.

In Patent Literature 1, the film thickness is set so as to minimize the reflectance by use of the aforementioned interference phenomenon. In a case where the absorber film has a two-layer structure of a tantalum nitride (TaN) film and a tantalum oxynitride (TaON) film (5 nm thick), as illustrated in the simulation result of FIG. 16, the reflectance has a minimum value when the film thickness of the absorber film is around 61 nm. Thus, the reflectance of 2% or less can be obtained.

As is understood from the relation (4), the interference term is proportional to the absolute value $|r_S|$ of the amplitude of the reflected light B reflected by the surface of the absorber film. Therefore, as the absolute value of the amplitude of the reflected light B is increased, the interference effect is increased so that the minimum value of the reflectance R can be reduced accordingly.

The amplitude $r_{ABS}$ of the reflected light B on the absorber surface is expressed by the following relation (5) when the absorber film has a refractive index $n_{ABS}$ and an absorption coefficient $k_{ABS}$.

$$r_{ABS}=(n_{ABS}+ik_{ABS}-1)/(n_{ABS}+ik_{ABS}+1) \quad (5)$$

Therefore, the absolute value of the amplitude $r_{ABS}$ is expressed by the following relation (6).

$$|r_{ABS}|=((n_{ABS}-1)^2+k_{ABS}^2)^{1/2}/((n_{ABS}+1)^2+k_{ABS}^2)^{1/2} \quad (6)$$

In order to increase the absolute value $|r_{ABS}|$ of the amplitude of the reflected light B on the surface of the absorber film, it is desired to select an absorber material whose refractive index $n_{ABS}$ is as small as possible. However, various conditions such as optical constants, film stress, an etching rate, cleaning resistance, defect test correspondence, defect correction correspondence, etc. are imposed on the selection of the absorber material. Various problems must be solved when the absorber material is changed from currently used tantalum-based material to another material.

Figure 1:
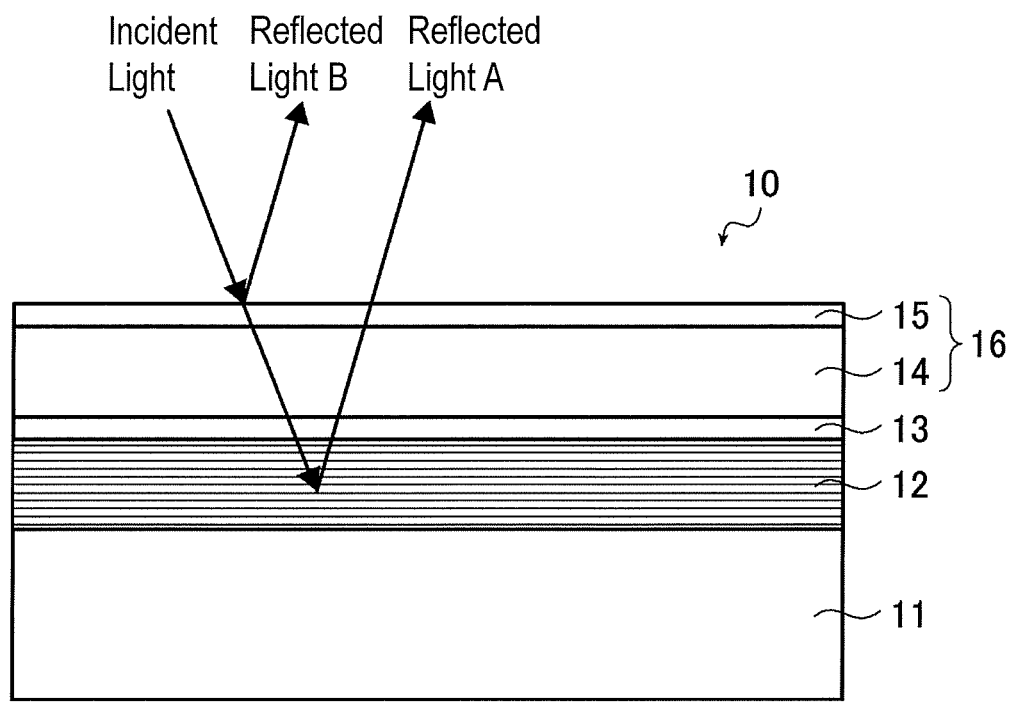
FIG. 1 is a schematic sectional view of a reflective mask blank in Embodiment 1.

FIG. 1 shows a reflective mask blank of Embodiment 1 in the present invention. In the reflective mask blank 10 shown in FIG. 1, a multilayer reflective film 12, a protective film 13, and a pattern film 16 which will be partially etched when processing into a mask, are formed sequentially on/above a substrate 11. The pattern film 16 includes an absorber film 14 and a surface reflection enhancing film 15 in this order from the substrate side. Since the mask pattern film 16 includes the absorber film 14 and the surface reflection enhancing film 15 in this order from the substrate side in the reflective mask blank 10 shown in FIG. 1, interference occurs between reflected light A reflected by the multilayer film 12 and reflected light B reflected by the surface of the surface reflection enhancing film 15 forming the surface of the mask pattern film 16. Due to the interference, the surface reflected light can be enhanced while the selection of the absorber film 14 can be made easier.

In the reflective mask blank 10 shown in FIG. 1, the absolute value of the amplitude of the reflected light B reflected by the surface of the surface reflection enhancing film 15 is expressed by the following relation (7) when the surface reflection enhancing film 15 has a refractive index n and an absorption coefficient k.

$$|r|=((n-1)^2+k^2)^{1/2}/((n+1)^2+k^2)^{1/2} \quad (7)$$

In the reflective mask blank 10 shown in FIG. 1, when the absolute value of the amplitude of the reflected light B reflected by the surface of the surface reflection enhancing film 15 is made larger than the aforementioned absolute value $|r_{ABS}|$ of the amplitude of the reflected light B on the surface of the absorber film, the effect of the interference can be increased to reduce the minimum value of the reflectance R of the reflective mask blank 10.

The reflective mask blank 10 shown in FIG. 1 satisfies the following relation (8) when the absorber film 14 has a refractive index $n_{ABS}$ and an absorption coefficient $k_{ABS}$ at a wavelength of 13.53 nm and the surface reflection enhancing film 15 has a refractive index n and an absorption coefficient k at the same wavelength.

$$((n-1)^2+k^2)^{1/2}>((n_{ABS}-1)^2+k_{ABS}^2)^{1/2}+0.03 \quad (8)$$

The aforementioned relation (8) is derived from the aforementioned relations (6) and (7). In the wavelength range of EUV light, the refractive index $n_{ABS}$ of the absorber film 14 and the refractive index n of the surface reflection enhancing film 15 take values close to 1, and the absorption coefficient $k_{ABS}$ of the absorption film 14 and the absorption coefficient k of the surface reflection enhancing film 15 take values close to 0. Therefore, the denominator in each of the relations (6) and (7) is approximately 2 regardless of the constituent materials of the absorber film 14 and the surface reflection enhancing film 15. The constant 0.03 in the right side of the relation (8) is a value which was found out from the graph of complex indices of refraction in metal elements shown in FIG. 5 when the constituent material of the surface reflection enhancing film 15 and the constituent material of the absorber film 14 were specified.

When the aforementioned relation (8) is satisfied, the effect of the interference can be increased to reduce the minimum value of the reflectance R of the reflective mask blank 10.

When the refractive index n of the surface reflection enhancing film 15 is selected to be smaller than the refractive index $n_{ABS}$ of the absorber film 14, the absolute value of the amplitude of the reflected light B is larger. When the absorber film 14 is made of a tantalum-based material in the same manner as in the background art, it is desired that the refractive index n of the surface reflection enhancing film 15 is 0.95 or less.

Figure 2:
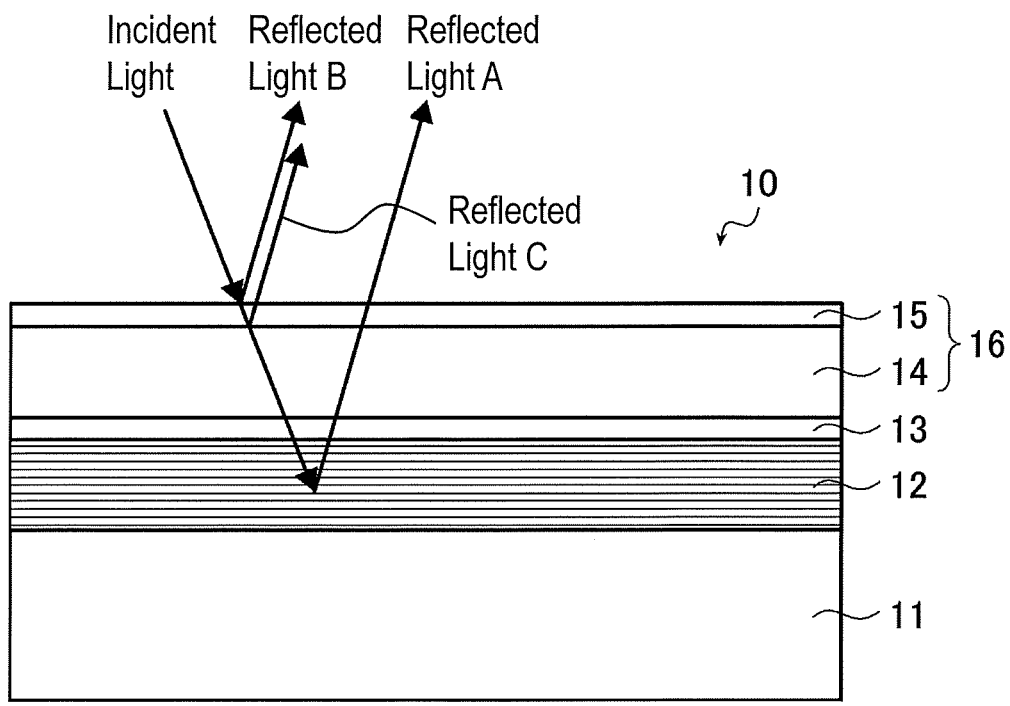
FIG. 2 is a view similar to FIG. 1, but illustrating reflected light C reflected by an interface between a surface reflection enhancing film 15 and an absorber film 14.

In addition, as shown in FIG. 2, reflected light C is also generated from the interface between the surface reflection enhancing film 15 and the absorber film 14 in the reflective mask blank 10. When phases of the reflected lights B and C are aligned, the surface reflected light can be further enhanced due to interference occurring between the reflected light A and each of the reflected lights B and C.

Conditions with which the phases of the reflected light B and the reflected light C can be aligned are provided by the following relation (9) using the refractive index n and film thickness d of the surface reflection enhancing film 15. The resultant come to be the optimum value of the film thickness d of the surface reflection enhancing film 15.

$$d=\lambda/4n \quad (9)$$

Figure 3:
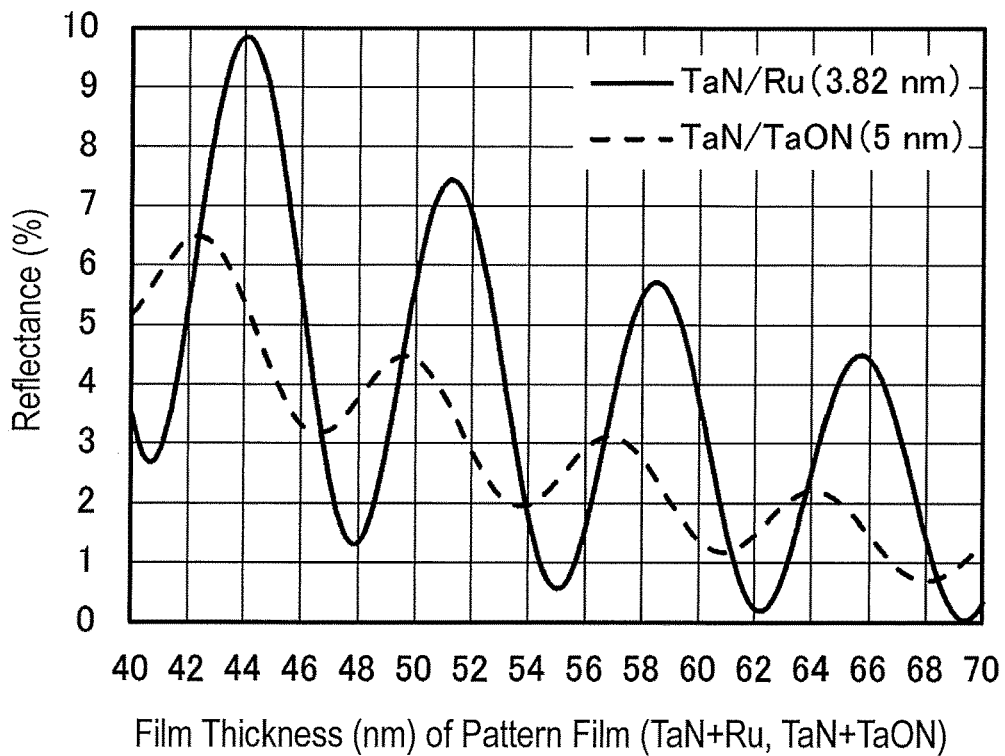
FIG. 3 is a graph showing the relationship between film thickness of a pattern film (TaN film and Ru film) or an absorber film (TaN film and TaON film) and reflectance in a case where the pattern film has a two-layer structure of a TaN film and an Ru film (film thickness of 3.82 nm) in the reflective mask blank in the present invention and in a case where the absorber film has a two-layer structure of a TaN film and a TaON film (film thickness of 5 nm) in a reflective mask blank in Patent Literature 1.

FIG. 3 shows the simulation result as to the dependency of reflectance on the film thickness when a tantalum nitride (TaN) film was selected as the absorber film 14 and a ruthenium (Ru) film was selected as the surface reflection enhancing film 15. Values (n, k)=(0.886, 0.017) at a wavelength of 13.53 nm were used as the refractive index n and the absorption coefficient k of the ruthenium film.

In addition, the film thickness of the ruthenium film was set at 13.53 nm/4/0.886=3.82 nm based on the aforementioned relation (9).

In addition, the film thickness of the pattern film 16 which was a total value of the film thicknesses of the absorber film 14 and the surface reflection enhancing film 15 was selected in the abscissa in FIG. 3.

Figure 16:
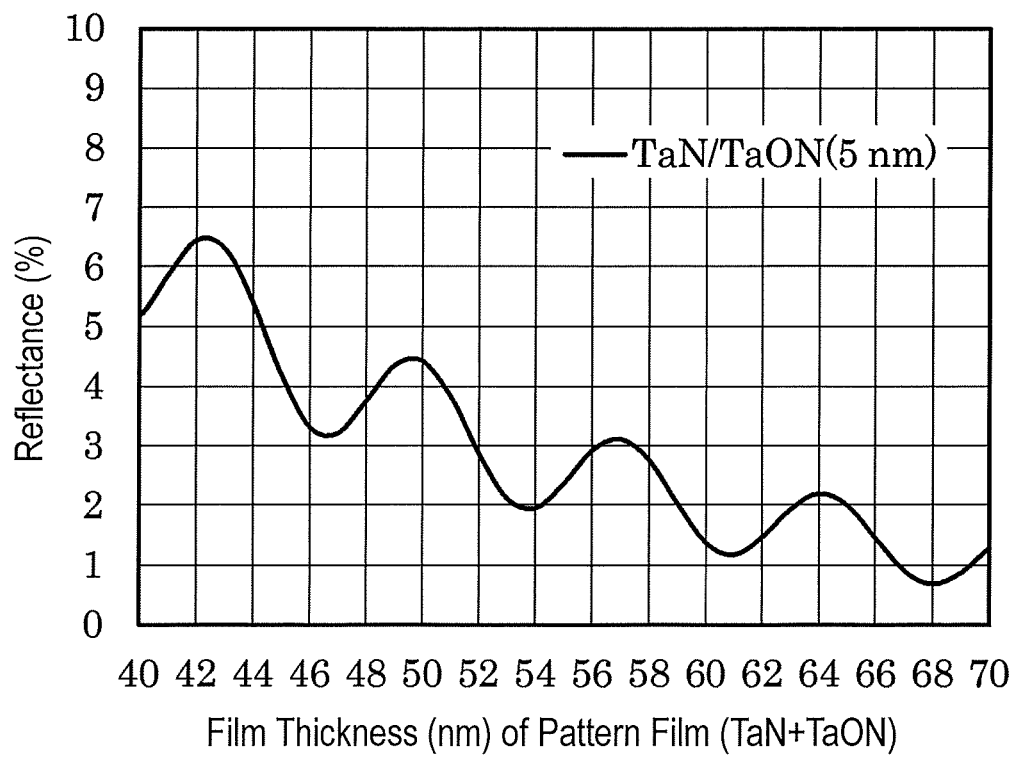
FIG. 16 is a graph showing the relationship between film thickness of an absorber film (TaN film and TaON film) and reflectance in a case where the absorber film has a two-layer structure of a TaN film and a TaON film (film thickness of 5 nm) in the reflective mask blank in Patent Literature 1.

In FIG. 3, the simulation result of FIG. 16, that is, the simulation result as to the case of the reflective mask blank in Patent Literature 1 is shown together.

From comparison between the two simulation results, it can be found that the amplitude of the reflectance in the reflective mask blank in the present invention is larger. This is because the surface reflection is enhanced due to the refractive index of ruthenium which is smaller than the refractive index of the tantalum-based material. Although the absorber film thickness must be set at about 61 nm in the background art in order to set the reflectance at 2% or less, the pattern film thickness can be reduced to about 48 nm in the present invention.

Figure 4:
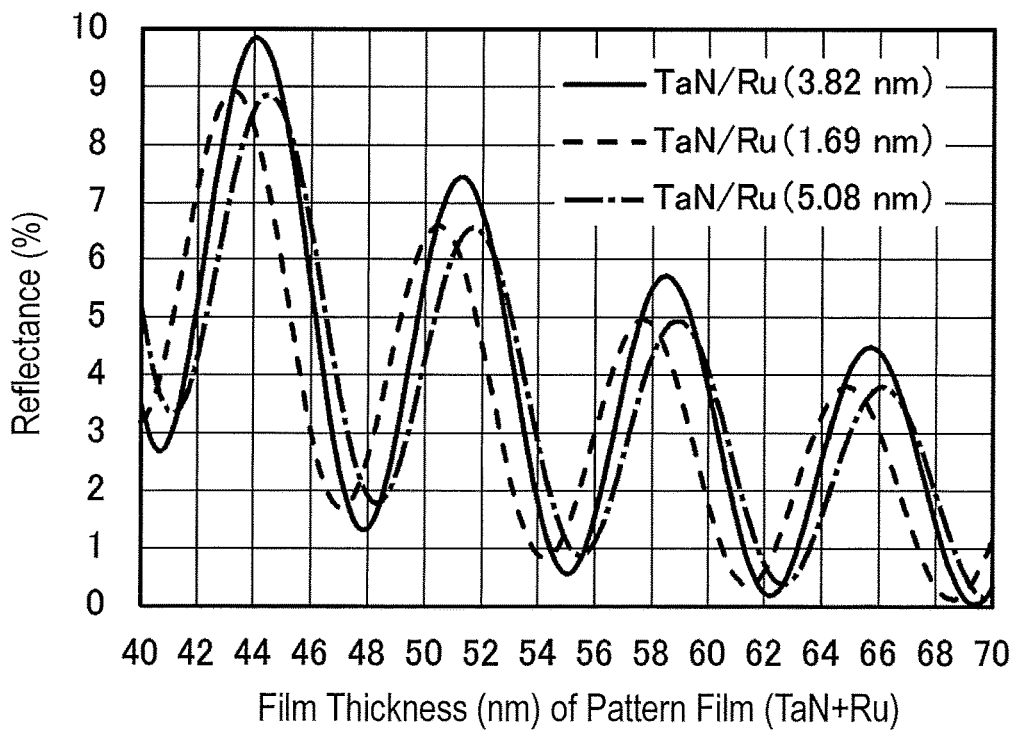
FIG. 4 is a graph showing the relationship between film thickness of a pattern film (TaN film and Ru film) and reflectance in a case where the pattern film has a two-layer structure of a TaN film and an Ru film (film thickness of 3.82 nm, 1.69 nm or 5.08 nm) in the reflective mask blank in the present invention.

FIG. 4 shows the simulation result as to the dependency of reflectance on the film thickness when a tantalum nitride (TaN) film was selected as the absorber film 14 and a ruthenium (Ru) film was selected as the surface reflection enhancing film 15 in the same manner as in FIG. 3. However, the Ru film had three film thicknesses, more specifically, 1.69 nm, 3.82 nm and 5.08 nm, in FIG. 4. The amplitude of the reflectance in the case where the film thickness of the Ru film was 1.69 nm or 5.08 nm was smaller than the case where the film thickness of the Ru film was optimized to be 3.82 nm.

The preferred value of the film thickness d of the surface reflection enhancing film 15 is expressed by the following relation (10) from the simulation result.

$$13.53 \text{ nm}/4n \times 0.5 < d < 13.53 \text{ nm}/4n \times 1.5 \quad (10)$$

As apparent from above, the ruthenium (Ru) film has suitable properties as the surface reflection enhancing film 15. However, Ru is used as the protective film 13 of the multilayer reflective film 12. The Ru film is hardly etched in comparison with the tantalum-based material forming the absorber film 14. When the surface reflection enhancing film 15 is an Ru film, it is therefore preferable that the film thickness of the surface reflection enhancing film 15 is reduced to improve proccessability into a mask. When the surface reflection enhancing film 15 is an Ru film, it is preferable that the film thickness d of the surface reflection enhancing film 15 satisfies the following relation (11) when the absorber film 14 has a film thickness $d_{ABS}$.

$$d < 1/10 \times d_{ABS} \quad (11)$$

Although description has been made above in the case where the surface reflection enhancing film 15 is an Ru film, the constituent material of the surface reflection enhancing film 15 is not limited thereto. Any material may be used as long as it has a refractive index n and an absorption coefficient k satisfying the aforementioned relation (8) in relation to the refractive index $n_{ABS}$ and absorption coefficient $k_{ABS}$ of the absorber film 14.

Figure 5:
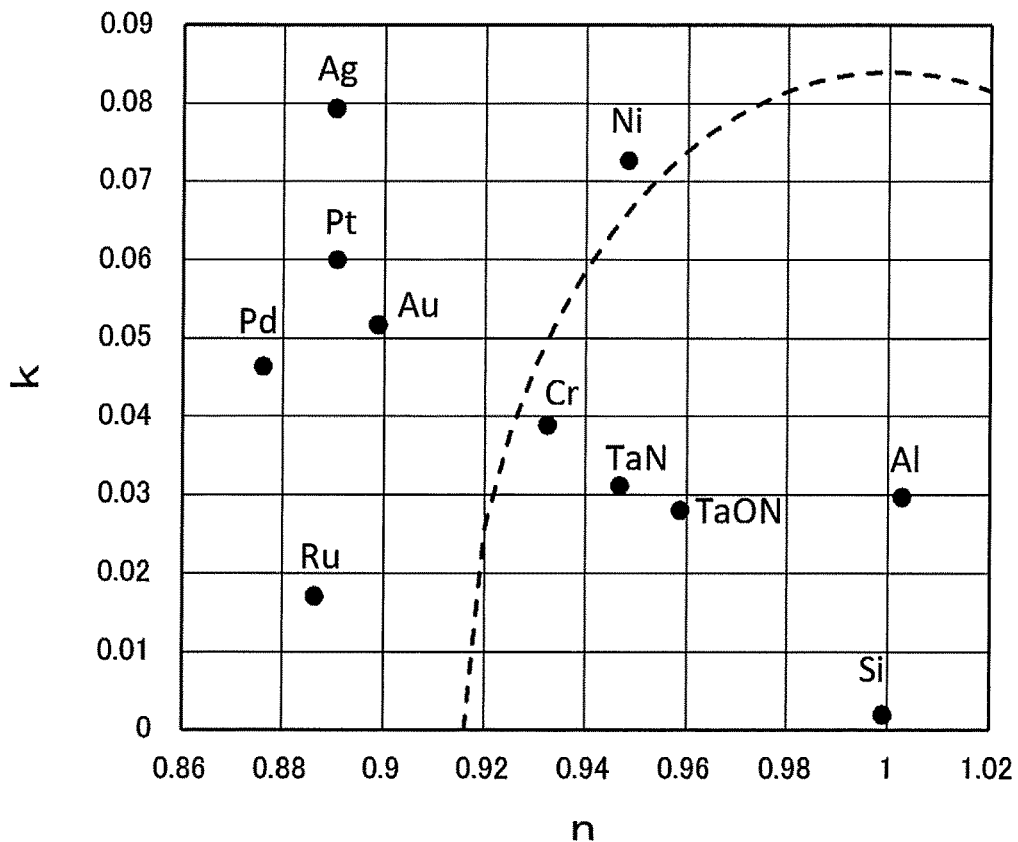
FIG. 5 is a graph of complex indices of refraction in metal elements.

FIG. 5 shows the graph of complex indices of refraction in metal elements. The broken line in FIG. 5 corresponds to the following relation (12).

$$((n-1)^2 + k^2)^{1/2} = ((n_{ABS}-1)^2 + k_{ABS}^2)^{1/2} + 0.03 \quad (12)$$

When the constituent material of the absorber film 14 is a metal element on the right side of the broken line in FIG. 5, a metal element on the left side of the broken line can be used as the constituent material of the surface reflection enhancing film 15. For example, when the constituent material of the absorber film 14 is a tantalum-based material such as TaN or TaON, Ag, Pt, Pd, Au, Ru or Ni can be used as the constituent material of the surface reflection enhancing film 15.

When the constituent material of the surface reflection enhancing film 15 is the other material than the aforementioned Ru, the preferred value of the film thickness d of the surface reflection enhancing film 15 can be expressed by the aforementioned relation (10). In addition, when the constituent material of the surface reflection enhancing film 15 is more difficult to be etched than the tantalum-based material, it is preferable that the film thickness d of the surface reflection enhancing film 15 satisfies the aforementioned relation (11).

Figure 6:
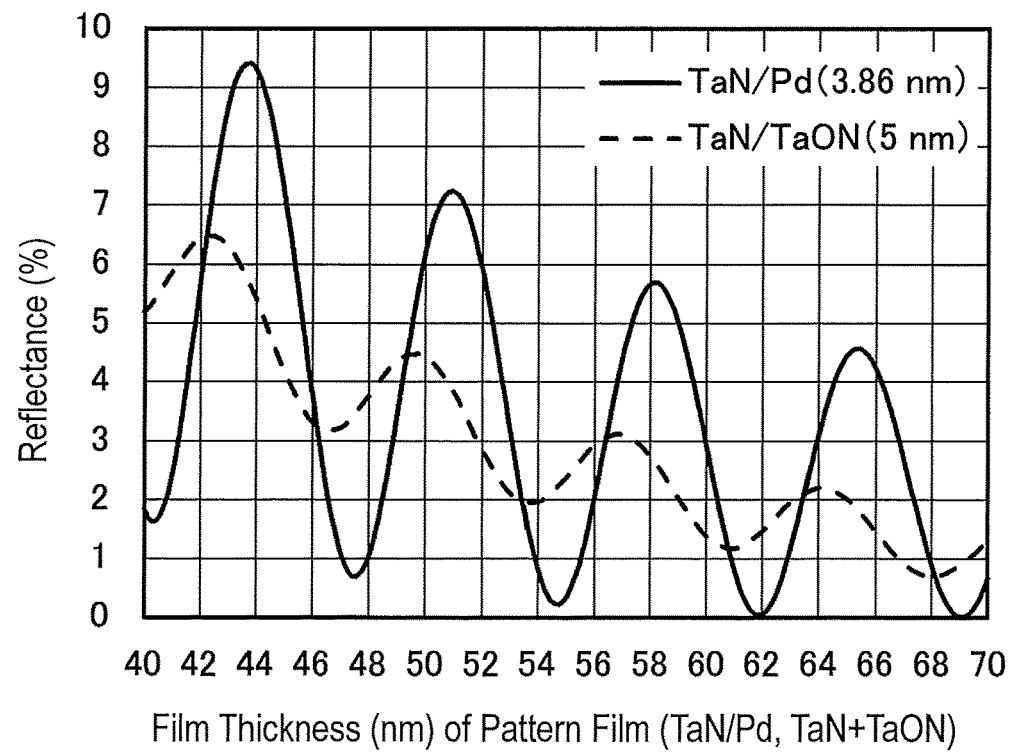
FIG. 6 is a graph showing the relationship between film thickness of a pattern film (TaN film and Pd film) or an absorber film (TaN film and TaON film) and reflectance in a case where the pattern film has a two-layer structure of a TaN film and a Pd film (film thickness of 3.82 nm) in the reflective mask blank in the present invention and in a case where the absorber film has a two-layer structure of a TaN film and a TaON film (film thickness of 5 nm) in the reflective mask blank in Patent Literature 1.

FIG. 6 shows the simulation result as to the dependency of reflectance on the film thickness when a tantalum nitride (TaN) film was selected as the absorber film 14 and a palladium (Pd) film was selected as the surface reflection enhancing film 15. Palladium (Pd) is located on the left side of the broken line in FIG. 5. Values (n, k)=(0.876, 0.046) at a wavelength of 13.53 nm were used as the refractive index n and absorption coefficient k of the palladium film.

In addition, the film thickness of the palladium film was set at 13.53 nm/4/0.876=3.86 nm based on the aforementioned relation (9).

In addition, the film thickness of the pattern film 16 which was a total value of the film thicknesses of the absorber film 14 and the surface reflection enhancing film 15 was selected in the abscissa in FIG. 6.

In FIG. 6, the simulation result of FIG. 16, that is, the simulation result as to the case of the reflective mask blank in Patent Literature 1 is shown together.

From comparison between the two simulation results, it can be found that the amplitude of the reflectance in the reflective mask blank in the present invention is larger. This is because the surface reflection is enhanced due to the refractive index of palladium which is smaller than the refractive index of the tantalum-based material. Although the absorber film thickness must be set at about 61 nm in the background art in order to set the reflectance at 2% or less, the pattern film thickness can be reduced to about 40 nm in the present invention.

Figure 7:
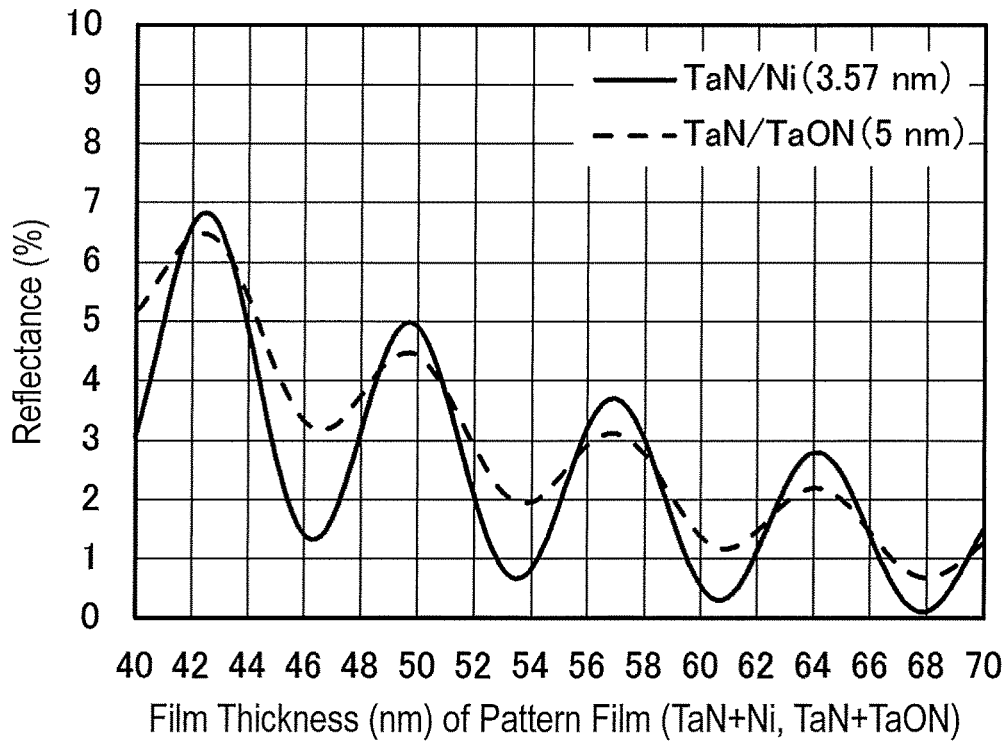
FIG. 7 is a graph showing the relationship between film thickness of a pattern film (TaN film and Ni film) or an absorber film (TaN film and TaON film) and reflectance in a case where the pattern film has a two-layer structure of a TaN film and an Ni film (film thickness of 3.57 nm) in the reflective mask blank in the present invention and in a case where the absorber film has a two-layer structure of a TaN film and a TaON film (film thickness of 5 nm) in the reflective mask blank in Patent Literature 1.

FIG. 7 shows the simulation result as to the dependency of reflectance on the film thickness when a tantalum nitride (TaN) film was selected as the absorber film 14 and a nickel (Ni) film was selected as the surface reflection enhancing film 15. Nickel (Ni) is located on the left side of the broken line in FIG. 5. Values (n, k)=(0.948, 0.073) at a wavelength of 13.53 nm were used as the refractive index n and absorption coefficient k of the nickel film.

In addition, the film thickness of the nickel film was set at 13.53 nm/4/0.948=3.57 nm based on the aforementioned relation (9).

In addition, the film thickness of the pattern film 16 which was a total value of the film thicknesses of the absorber film 14 and the surface reflection enhancing film 15 was selected in the abscissa in FIG. 7.

In FIG. 7, the simulation result of FIG. 16, that is, the simulation result as to the case of the reflective mask blank in Patent Literature 1 is shown together.

From comparison between the two simulation results, it can be found that the amplitude of the reflectance in the reflective mask blank in the present invention is larger. This is because the surface reflection is enhanced due to the refractive index of nickel which is smaller than the refractive index of the tantalum-based material. Although the absorber film thickness must be set at about 61 nm in the background art in order to set the reflectance at 2% or less, the pattern film thickness can be reduced to about 46 nm in the present invention.

Figure 8:
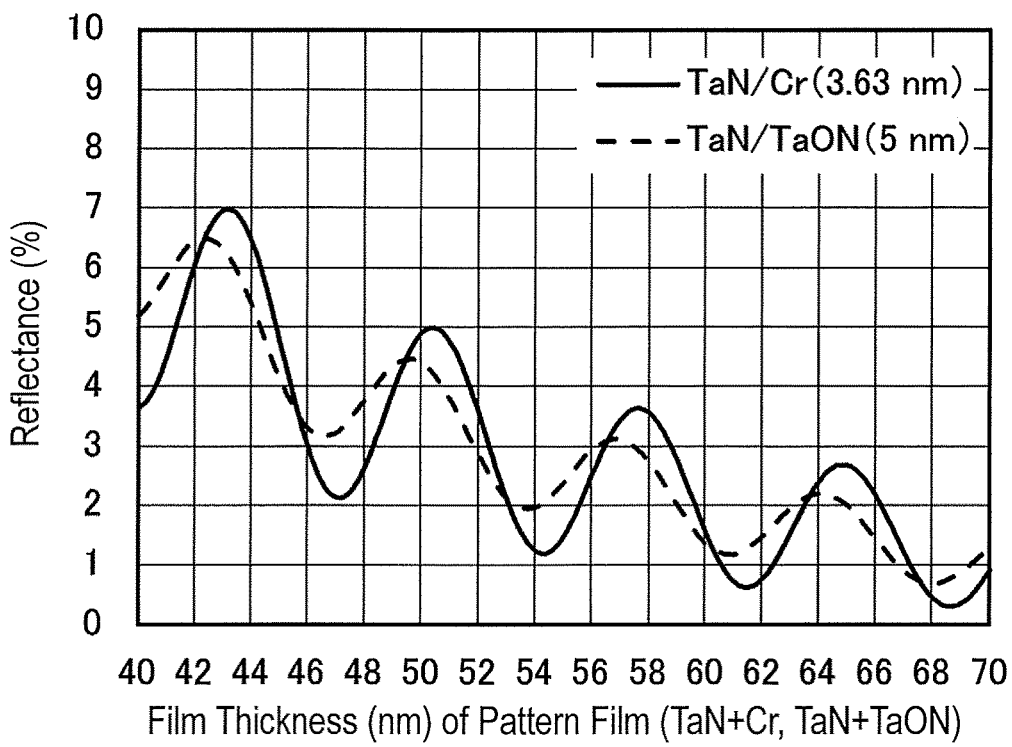
FIG. 8 is a graph showing the relationship between film thickness of a pattern film (TaN film and Cr film) or an absorber film (TaN film and TaON film) and reflectance in a case where the pattern film has a two-layer structure of a TaN film and a Cr film (film thickness of 3.63 nm) in the reflective mask blank in the present invention and in a case where the absorber film has a two-layer structure of a TaN film and a TaON film (film thickness of 5 nm) in the reflective mask blank in Patent Literature 1.

FIG. 8 shows the simulation result as to the dependency of reflectance on the film thickness when a tantalum nitride (TaN) film was selected as the absorber film 14 and a chromium (Cr) film was selected as the surface reflection enhancing film 15. Chromium (Cr) is located on the right side of the broken line in FIG. 5. Values (n, k)=(0.932, 0.039) at a wavelength of 13.53 nm were used as the refractive index n and absorption coefficient k of the chromium film.

In addition, the film thickness of the chromium film was set at 13.53 nm/4/0.932=3.63 nm based on the aforementioned relation (9).

In addition, the film thickness of the pattern film 16 which was a total value of the film thicknesses of the absorber film 14 and the surface reflection enhancing film 15 was selected in the abscissa in FIG. 8.

In FIG. 8, the simulation result of FIG. 16, that is, the simulation result as to the case of the reflective mask blank in Patent Literature 1 is shown together.

From comparison between the two simulation results, it can be found that there is a small difference in amplitude of reflectance. This is because the difference in refractive index between chromium and the tantalum-based material is too small not to enhance the surface reflection. In order to set the reflectance at 2% or less, the film thickness can be reduced to about 54 nm.

Embodiment 2

As is described above, the reflective mask blank 10 in Embodiment 1 of the present invention has an effect of interference between EUV light reflected by the pattern film surface and EUV light reflected by the multilayer reflective film due to the presence of the surface reflection enhancing film 15 satisfying the aforementioned relation (8), so that the pattern film thickness with which the reflectance can be set at 2% or less can be made thinner than the absorber film thickness in the background art.

Figure 9:
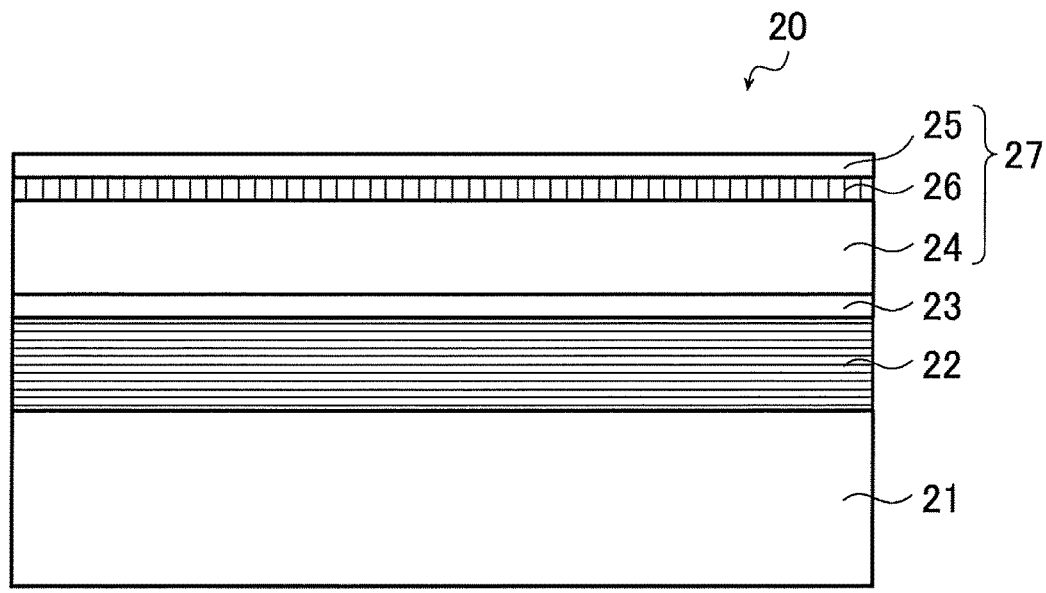
FIG. 9 is a schematic sectional view of a reflective mask blank in Embodiment 2.

FIG. 9 shows a reflective mask blank in Embodiment 2 of the present invention. In the reflective mask blank 20 in Embodiment 2 as shown in FIG. 9, a multilayer reflective film 22, a protective film 23, and a pattern film 27 which will be partially etched when processing into a mask, are formed sequentially on/above a substrate 21. The pattern film 27 includes an absorber film 24, a surface reflection assisting film 26 and a surface reflection enhancing film 25 in this order from the substrate side. That is, the surface reflection assisting film 26 is formed between the absorber film 24 and the surface reflection enhancing film 25 in the pattern film 27.

When the surface reflection assisting film 26 has a refractive index $n_B$ at a wavelength of 13.53 nm, the surface reflection assisting film 26 satisfies the following relation (13) in relation to the refractive index $n_{ABS}$ of the absorber film 24 at a wavelength of 13.53 nm and the refractive index n of the surface reflection enhancing film 25 at a wavelength of 13.53 nm.

$$n < n_{ABS} < n_B \quad (13)$$

With such a configuration, the amplitude of the EUV light reflected by the pattern film surface is further increased, and the effect of interference with the EUV light reflected by the multilayer reflective film is also increased. Thus, the pattern film thickness with which the reflectance can be set at 2% or less can be made thinner.

As described above, when the absorber film 24 is made of the tantalum-based material as in the background art, it is desired that the refractive index n of the surface reflection enhancing film 25 is 0.95 or less. It is therefore desired that the refractive index $n_B$ of the surface reflection assisting film 26 is 0.95 or more.

Although not shown, reflected light reflected by the surface of the surface reflection enhancing film 25, reflected light reflected by the interface between the surface reflection enhancing film 25 and the surface reflection assisting film 26, and reflected light reflected by the interface between the surface reflection assisting film 26 and the absorber film 24 are generated in the reflective mask blank 20, as shown in FIG. 9. When the phases of those reflected lights are aligned, the amplitude of the EUV light reflected by the pattern film surface can be further increased.

As for conditions with which the phases of the reflected lights can be aligned, when the surface reflection enhancing film 25 has a refractive index n and film thickness d and the surface reflection assisting film 26 has a refractive index $n_B$ and film thickness $d_B$, the optimum values of d and $d_B$ are expressed as follows.

$$d = \lambda/4n \quad (14)$$

$$d_B = \lambda/4n_B \quad (15)$$

Figure 10:
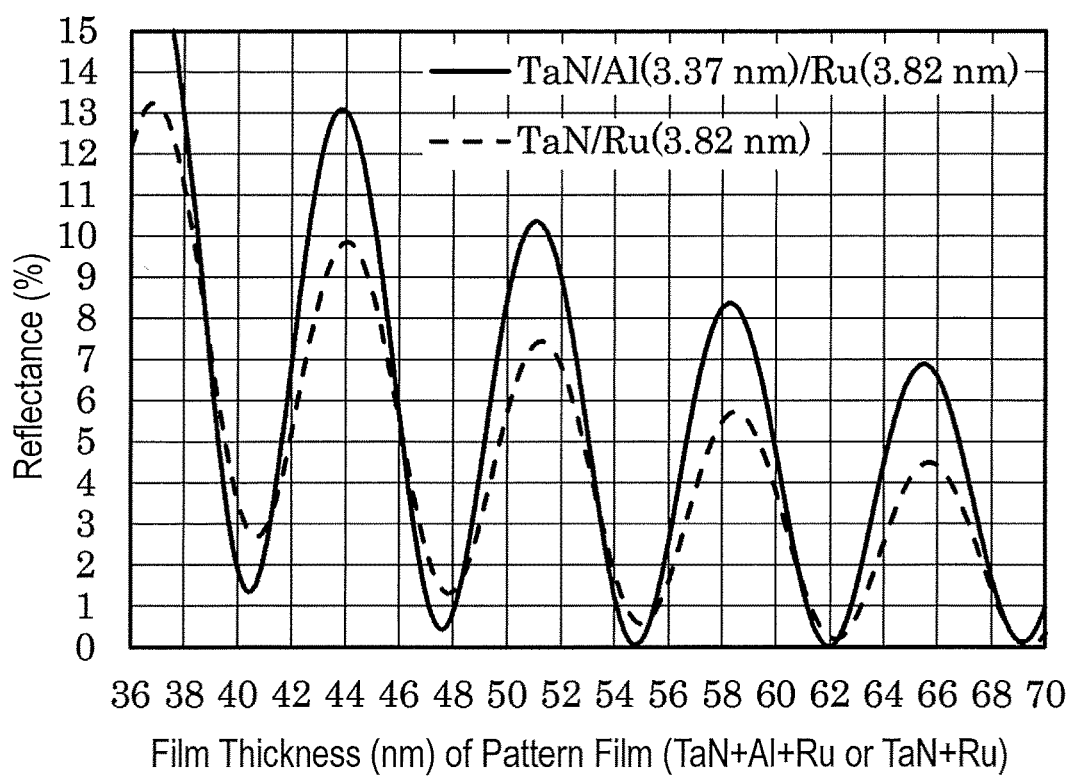
FIG. 10 is a graph showing the relationship between film thickness of a pattern film (TaN film and Ru film, or TaN film, Al film and Ru film) and reflectance in a case where the pattern film has a two-layer structure of a TaN film and an Ru film (film thickness of 3.82 nm) in the reflective mask blank in the present invention and in a case where the pattern film has a three-layer structure of a TaN film, an Al film (film thickness of 3.37 nm) and an Ru film (film thickness of 3.82 nm) in the reflective mask blank in the present invention.

FIG. 10 shows the simulation result as to the dependency of reflectance on the film thickness when a tantalum nitride (TaN) film was selected as the absorber film 24, an aluminum (Al) film was selected as the surface reflection assisting film 26, and a ruthenium (Ru) film was selected as the surface reflection enhancing film 25. Values $(n_B, k_B) = (1.003, 0.03)$ at a wavelength of 13.53 nm were used as the refractive index $n_B$ and absorption coefficient $k_B$ of the aluminum (Al) film. In addition, the film thickness of the aluminum film was set at 13.53 nm/4/1.003=3.37 nm based on the aforementioned relation (15).

In addition, the film thickness of the pattern film 27 which was a total value of the film thicknesses of the absorber film 24, the surface reflection assisting film 26 and the surface reflection enhancing film 25 was selected in the abscissa in FIG. 10.

FIG. 10 also shows the simulation result of FIG. 3, that is, the simulation result as to the case of the reflective mask blank (the absorber film 14 which is a tantalum nitride (TaN) film, and the surface reflection enhancing film 25 which is a ruthenium (Ru) film) in Embodiment 1 of the present invention.

From FIG. 10, it can be found that when the surface reflection assisting film is formed between the absorber film and the surface reflection enhancing film, the amplitude of the reflectance is larger than the case where the surface reflection assisting film is absent. The pattern film thickness with which the reflectance can be set at 2% or less can be reduced to about 40 nm. From this result, it can be found that an aluminum-based material film containing aluminum (Al) is preferred as the surface reflection assisting film 26.

The preferred value of the film thickness $d_B$ of the surface reflection assisting film 26 is expressed by the following expression (16) based on the simulation result.

$$13.53 \text{ nm}/4n_B \times 0.5 < d_B < 13.53 \text{ nm}/4n_B \times 1.5 \quad (16)$$

Although description is made above in the case where the surface reflection assisting film 26 is an Al film, the constituent material of the surface reflection assisting film 26 is not limited thereto. Any material may be used as long as the refractive index $n_B$ at a wavelength of 13.53 nm satisfies the aforementioned relation (13) in relation to the refractive index $n_{ABS}$ of the absorber film 24 and the refractive index n of the surface reflection enhancing film 25.

For example, a metal element on the right side of the constituent material of the absorber film 24 can be used as the constituent material of the surface reflection assisting film 26. For example, when the constituent material of the absorber film 24 is a tantalum-based material such as TaN or TaON, a silicon-based material containing silicon (Si) can be used as the constituent material of the surface reflection assisting film 26.

When the constituent material of the surface reflection assisting film 26 is the other material than the aforementioned Al, the preferred value of the film thickness $d_B$ of the surface reflection assisting film 26 can be expressed by the aforementioned relation (16).

Figure 11:
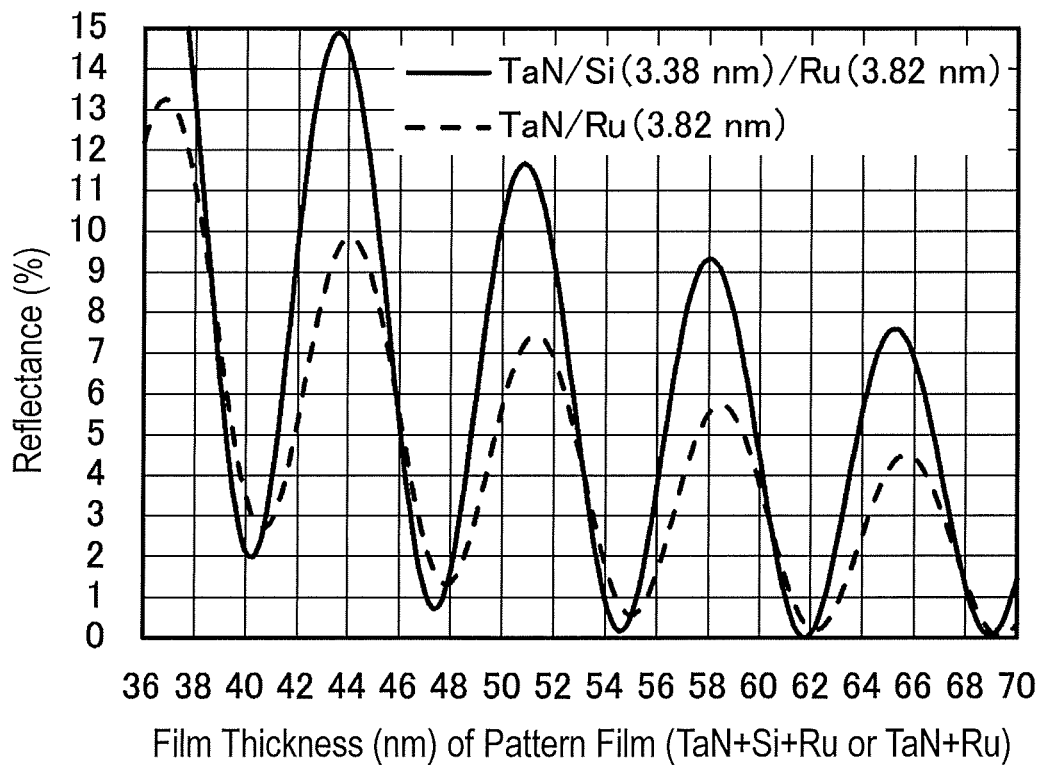
FIG. 11 is a graph showing the relationship between film thickness of a pattern film (TaN film and Ru film, or TaN film, Si film and Ru film) and reflectance in a case where the pattern film has a two-layer structure of a TaN film and an Ru film (film thickness of 3.82 nm) in the reflective mask blank in the present invention and in a case where the pattern film has a three-layer structure of a TaN film, an Si film (film thickness of 3.38 nm) and an Ru film (film thickness of 3.82 nm) in the reflective mask blank in the present invention.

FIG. 11 shows the simulation result as to the dependency of reflectance on the film thickness when a tantalum nitride (TaN) film was selected as the absorber film 24, a silicon (Si) film was selected as the surface reflection assisting film 26 and a ruthenium (Ru) film was selected as the surface reflection enhancing film 25. Values $(n_B, k_B)=(0.999, 0.002)$ at a wavelength of 13.53 nm were used as the refractive index $n_B$ and absorption coefficient $k_B$ of the silicon (Si) film.

In addition, the film thickness of the silicon film was set at 13.53 nm/4/0.999=3.38 nm from the aforementioned relation (15).

In addition, the film thickness of the pattern film 27 which was a total value of the film thicknesses of the absorber film 24, the surface reflection assisting film 26 and the surface reflection enhancing film 25 was selected in the abscissa in FIG. 11.

FIG. 11 also shows the simulation result of FIG. 3, that is, the simulation result as to the reflective mask blank (the absorber film 14 which is a tantalum nitride (TaN) film, and the surface reflection enhancing film 25 which is a ruthenium (Ru) film) in Embodiment 1 of the present invention.

From FIG. 11, it can be found that when the surface reflection assisting film is formed between the absorber film and the surface reflection enhancing film, the amplitude of the reflectance is larger than the case where the surface reflection assisting film is absent. The pattern film thickness with which the reflectance can be set at 2% or less can be reduced to about 47 nm.

Figure 15:
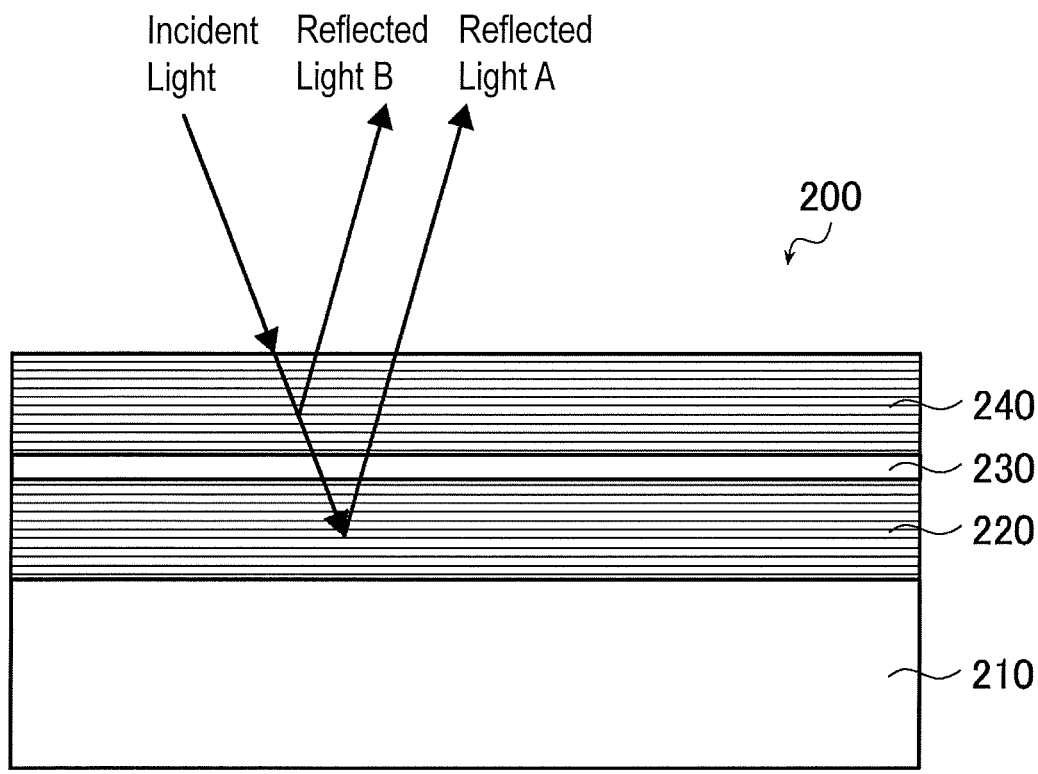
FIG. 15 is a schematic sectional view of a reflective mask blank in Patent Literature 2.

As a film configuration similar to the reflective mask blank in Embodiment 2 of the present invention, Patent Literature 2 discloses as an absorber film, the reflective mask blank 200 including the laminated absorber 240 in which low-refractive material films and high-refractive material films have been laminated alternately in a plurality of cycles, specifically in at least four cycles, using a structure of one low-refractive material film and one high-refractive material as one cycle, as shown in FIG. 15. On the other hand, the reflective mask blank 20 in Embodiment 2 of the present invention uses only one cycle of a laminated film of a low-refractive material film (surface reflection enhancing film 25) and a high-refractive material film (surface reflection assisting film 26) in the pattern film 27. Accordingly, the reflective mask blank 20 in Embodiment 2 of the present invention can reduce damage against the side wall of the pattern film when the pattern film is etched or cleansed when processing into a mask, in comparison with the reflective mask blank 200 in Patent Literature 2.

Embodiment 3

In the reflective mask blank 10 in Embodiment 1 of the present invention, the surface reflection enhancing film 15 is provided as a layer above the absorber film 14 in the configuration of the pattern film 16. A load with which the pattern film 16 is etched is larger than the case where only the absorber film 14 is etched as in the background-art reflective film blank 100 shown in FIG. 14. Accordingly, as the minimum line width of the mask pattern is reduced, it is more difficult to etch the pattern film 16. As a usual solution to this problem, there is a method in which a hard mask film made of a material having durability against the etching conditions of the absorber film is added.

Figure 12:
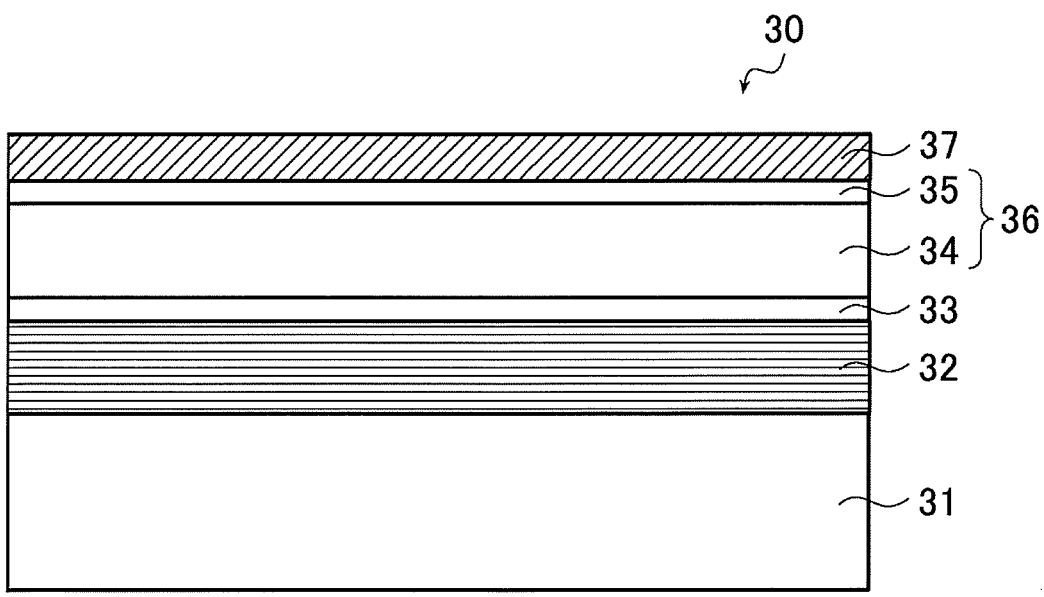
FIG. 12 is a schematic sectional view of a reflective mask blank in Embodiment 3.

In a reflective mask blank 30 in Embodiment 3 of the present invention as shown in FIG. 12, a multilayer reflective film 32, a protective film 33, and a pattern film 36 which will be partially etched when processing into a mask, are formed sequentially on/above a substrate 31. The pattern film 36 includes an absorber film 34 and a surface reflection enhancing film 35 in this order from the substrate side. In the reflective mask blank 30 in Embodiment 3 of the present invention as shown in FIG. 12, a hard mask film 37 is provided on the pattern film 36. In the reflective mask blank 30 in Embodiment 3 of the present invention, the surface reflection assisting film as in the reflective mask blank in Embodiment 2 of the present invention may be provided between the absorber film 34 and the surface reflection enhancing film 35.

The material of the hard mask film 37 must be a material which can ensure the selectivity when the surface reflection enhancing film 35 is etched. As the material of the hard mask film 37, a tantalum-based material, a chromium-based material or a silicon-based material can be selected depending on the material of the surface reflection enhancing film 35.

In the above description, a tantalum nitride (TaN) film is selected as the absorber film 14 and a ruthenium (Ru) film is selected as the surface reflection enhancing film 15 as an example of the reflective mask blank 10 in Embodiment 1 of the present invention. When a tantalum nitride (TaN) film is selected as the absorber film 34 and a ruthenium (Ru) film is selected as the surface reflection enhancing film 35 in the reflective mask blank 30 in Embodiment 3 of the present invention, a tantalum nitride (TaN) film can be selected as the hard mask film 37. In this case, higher etching selectivity with oxygen gas can be achieved when the ruthenium (Ru) film as the surface reflection enhancing film 35 is etched. After that, the absorber film 34 and the hard mask film 37 are etched simultaneously by chlorine gas. Thus, the step of removing the hard mask can be simplified.

Figure 13:
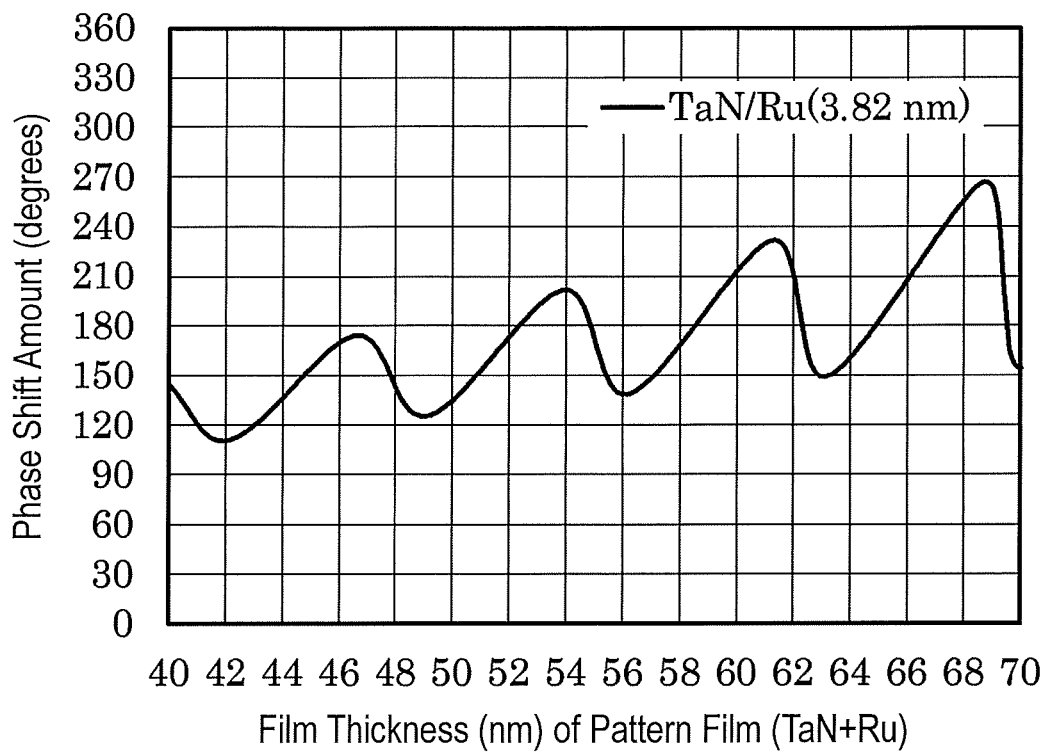
FIG. 13 is a graph showing the relationship between film thickness of a pattern film (TaN film and Ru film) and a phase shift amount in a case where the pattern film has a two-layer structure of a TaN film and an Ru film (film thickness of 3.82 nm) in the reflective mask blank in the present invention.

Film configurations formed of a tantalum-based film and a ruthenium film similarly to the present invention are disclosed in Patent Literature 3 and Patent Literature 4. However, Patent Literatures 3 and 4 relate to half tone phase shift masks. The reflectance of EUV light in the reflective mask blank in the present invention is low to be 2% or less, which is much lower than reflectance of 6% usually used in such a half tone phase shift mask. Further, as shown in FIG. 13, in the reflective mask blank in the present invention, the phase shift amount for the optimum pattern film thickness of 48 nm is 142 degrees, which deviates largely from the optimum value of 180 degrees as a phase shift mask. FIG. 13 is the graph showing the relationship between the film thickness of the pattern film (TaN film and Ru film) and the phase shift amount when the pattern film in the reflective mask blank in the present invention has a two-layer structure of a TaN film and an Ru film (film thickness of 3.82 nm).

In this manner, the reflective mask blank in the present invention transfers a mask pattern onto a wafer due to a function of so-called binary mask, but does not have a function as a phase shift mask.

In the reflective mask blank in each of Embodiments 1 to 3 of the present invention, any other configuration than the pattern film and the hard mask film is similar to that of the background-art reflective mask blank. That is, a low thermal expansion glass in which a small quantity of titanium has been added to synthetic quartz in order to prevent pattern distortion caused by thermal expansion during exposure is used suitably as the substrate. A film in which molybdenum films and silicon films have been laminated alternately in about 40 cycles is usually used as the multilayer reflective film. A ruthenium-based material having a thickness of 1 to 5 nm is usually used as the protective film.

Embodiment 4

Embodiment 4 of the present invention is directed to a binary reflective mask in which the pattern film is patterned in the reflective mask blank in any one of Embodiments 1 to 3 of the present invention.

EXAMPLE

The present invention will be described below along its example. In this example, the reflective mask blank 10 shown in FIG. 1 is formed.

An $SiO_2$—$TiO_2$ based glass substrate (6 inches (about 152 mm) square in outer dimensions, and about 6.3 mm thick) is used as a substrate 11 for forming films thereon. The coefficient of thermal expansion of the glass substrate is $0.02 \times 10^{-7}/°$ C. The glass substrate is polished to have a smooth surface whose surface roughness (rms) is 0.15 nm or less and whose flatness is 100 nm or less. A chromium film having a thickness of 100 nm is formed on the back surface side of the substrate 11 by use of a magnetron sputtering method. Thus, a highly dielectric coating having a sheet resistance of 100 Ω/square is applied to the back surface side of the substrate 11. Using the chromium film formed, the substrate 11 is fixed to a usual electrostatic chuck having a flat plate shape, and silicon films and molybdenum films are formed alternately on/above the surface of the substrate 11 repeatedly in 40 cycles by use of an ion beam sputtering method. Thus, a multilayer reflective film 12 having a total film thickness of 272 nm ((4.5 nm+2.3 nm)×40) is formed.

Further, a ruthenium film (film thickness of 2.5 nm) is formed on the multilayer reflective film 12 by use of an ion beam sputtering method. Thus, a protective film 13 is formed.

Next, an absorber film 14 made of tantalum nitride is formed to have a thickness of 44 nm on the protective film 13 by magnetron sputtering. Tantalum is used as a target, and mixed gas of argon and nitrogen is used as sputtering gas.

Finally, a surface reflection enhancing film 15 made of ruthenium is formed to have a thickness of 3.8 nm on the absorber film 14 by magnetron sputtering. Ruthenium is used as a target, and argon is used as sputtering gas.

EUV light having a wavelength of 13.5 nm enters the reflective mask blank 10 manufactured with an incident angle of 6 degrees, in order to measure the reflectance. The measured reflectance is 1.3%.

According to the reflective mask blank in this example, the total film thickness of the pattern film is 47.8 nm, which can be reduced on a large scale in comparison with the absorber film thickness of 61 nm in the background-art reflective mask blank.

While the present invention has been described in detail and with reference to specific embodiments thereof, it will be apparent to one skilled in the art that various changes and modifications can be made therein without departing from the spirit and scope thereof.

DESCRIPTION OF REFERENCE NUMERALS AND SIGNS

10 Reflective mask blank
11 Substrate
12 Multilayer reflective film
13 Protective film
14 Absorber film
15 Surface reflection enhancing film
16 Pattern film
20 Reflective mask blank
21 Substrate
22 Multilayer reflective film
23 Protective film
24 Absorber film
25 Surface reflection enhancing film
26 Surface reflection assisting film
27 Pattern film
30 Reflective mask blank
31 Substrate
32 Multilayer reflective film
33 Protective film
34 Absorber film
35 Surface reflection enhancing film
36 Pattern film
37 Hard mask film
100 Reflective mask blank
110 Substrate
120 Multilayer reflective film
130 Protective film
140 Absorber film
200 Reflective mask blank
210 Substrate
220 Multilayer reflective film
230 Protective film
240 Laminated absorber film

The invention claimed is:

1. A reflective mask blank which is a binary reflective mask blank comprising:
    a multilayer reflective film which reflects EUV light; and
    a pattern film to be partially etched when processing into a mask, the multilayer reflective film and the pattern film being placed on/above a substrate in this order from the substrate side;
    wherein the pattern film includes an absorber film which absorbs EUV light and a surface reflection enhancing film in this order from the substrate side, the surface reflection enhancing film is directly laminated on the absorber film, and
    the following relation is satisfied:

$$((n-1)^2+k^2)^{1/2} > ((n_{ABS}-1)^2+k_{ABS}^2)^{1/2}+0.03$$

wherein $n_{ABS}$ is a reflective index of the absorber film at a wavelength of 13.53 nm, $k_{ABS}$ is an absorption coefficient of the absorber film at a wavelength of 13.53 nm, n is a reflective index of the surface reflection enhancing film at a wavelength of 13.53 nm, and k is an absorption coefficient of the surface reflection enhancing film at a wavelength of 13.53 nm,
    wherein the refractive index n of the surface reflection enhancing film is 0.95 or less, and
    the pattern film has a thickness so that EUV light reflectance is 2% or less.

2. The reflective mask blank according to claim 1, wherein film thickness d of the surface reflection enhancing film satisfies the following relation using the refractive index n:

$$13.53 \text{ nm}/4n \times 0.5 < d < 13.53 \text{ nm}/4n \times 1.5.$$

3. The reflective mask blank according to claim 2, wherein the film thickness d of the surface reflection enhancing film satisfies the following relation:

$$d < 1/10 \times d_{ABS}$$

wherein $d_{ABS}$ is a film thickness of the absorber film.

4. The reflective mask blank according to claim 1, wherein the surface reflection enhancing film is a ruthenium-based material film containing ruthenium.

5. The reflective mask blank according to claim 1, wherein a protective film for protecting the multilayer reflective film is provided between the multilayer reflective film and the pattern film.

6. The reflective mask blank according to claim 1, wherein a hard mask film to be removed when processing into a mask is provided on the pattern film.

7. The reflective mask blank according to claim 6, wherein the hard mask film is selected from the group consisting of a tantalum-based material film containing a tantalum-based material, a chromium-based material film containing a chromium-based material, and a silicon-based material film containing a silicon-based material.

8. A binary reflective mask in which a pattern film of the reflective mask blank according to claim 1 has been patterned.

9. The reflective mask blank according to claim 1, wherein the surface reflection enhancing film is a single film with uniform composition.

10. The reflective mask blank according to claim 1, wherein the absorber film comprises a tantalum-based material.

11. The reflective mask blank according to claim 10, wherein the tantalum-based material is TaN.

12. The reflective mask blank according to claim 1, which comprises only a single surface reflection enhancing film with uniform composition.

* * * * *